(12) United States Patent
Kurkure et al.

(10) Patent No.: US 9,858,363 B2
(45) Date of Patent: Jan. 2, 2018

(54) ESTIMATING THINK TIMES USING A MEASURED RESPONSE TIME

(71) Applicant: VMware, Inc., Palo Alto, CA (US)

(72) Inventors: Uday Kurkure, Los Altos Hills, CA (US); Hari Sivaraman, Livermore, CA (US)

(73) Assignee: VMware, Inc., Palo Alto, CA (US)

( * ) Notice: Subject to any disclaimer, the term of this patent is extended or adjusted under 35 U.S.C. 154(b) by 897 days.

(21) Appl. No.: 14/247,008

(22) Filed: Apr. 7, 2014

(65) Prior Publication Data

US 2015/0286753 A1 Oct. 8, 2015

(51) Int. Cl.
*G06F 11/34* (2006.01)
*G06F 17/50* (2006.01)

(52) U.S. Cl.
CPC ...... *G06F 17/5009* (2013.01); *G06F 11/3414* (2013.01); *G06F 11/3419* (2013.01); *G06F 11/3457* (2013.01); *G06F 2201/81* (2013.01); *G06F 2201/815* (2013.01)

(58) Field of Classification Search
CPC ............ G06F 17/5009; G06F 11/3414; G06F 11/3419; G06F 11/3457; G06F 2201/815; G06F 2201/81
See application file for complete search history.

(56) References Cited

U.S. PATENT DOCUMENTS

| | | | | |
|---|---|---|---|---|
| 5,978,575 A * | 11/1999 | Packer | ............... | G06F 11/3414 703/21 |
| 6,792,393 B1 * | 9/2004 | Farel | .................. | G06F 11/3452 702/176 |
| 6,917,971 B1 * | 7/2005 | Klein | ................. | H04L 43/0864 702/186 |
| 7,630,862 B2 * | 12/2009 | Glas | .................... | G06F 11/3414 702/119 |
| 7,756,973 B2 * | 7/2010 | Alt | ......................... | G06Q 10/06 709/224 |
| 8,756,586 B2 * | 6/2014 | Khanapurkar | ...... | G06F 11/3414 717/130 |
| 2003/0074606 A1 * | 4/2003 | Boker | ................ | G06F 11/3414 714/42 |

OTHER PUBLICATIONS

Barna, C., et al. "Autonomic Load-Testing Framework" 8th ACM Int'l Conf. on Autonomic Computing, pp. 91-100 (2011) available fron <http://dl.acm.org/citation.cfm?id=1998598>.*

(Continued)

*Primary Examiner* — Jay B Hann

(57) ABSTRACT

Methods, systems, and computer programs, for estimating think times. One of the methods includes receiving a request to perform a test of one or more computing resources. The test of the one or more computing resources is performed by simulating an interaction of one or more simulated users with the one or more computing resources. Requests are submitted from the simulated user for execution by the one or more computing resources. Respective response times of the one or more computing resources to each of the requests are measured. An estimated think time of the simulated user is computed, wherein the estimated think time is computed based on at least one preceding response time.

20 Claims, 4 Drawing Sheets

(56) References Cited

OTHER PUBLICATIONS

Draheim, D., et al. "Realistic Load Testing of Web Applications" Software Maintenance & Reengineering, CSMR 2006 (2006) available from <http://ieeexplore.ieee.org/abstract/document/1602358/>.*

Hennessey, J. et al. *Computer Architecture: A Quantitative Approach.* 4th edition. Morgan Kaufmann Publishers, san Francisco, CA. Originally published 1990; 4$^{th}$ edition published 2007. pp. 372-373.

Brady, J. T. *A Theory of Productivity in the Creative Process* IEEE Computer Graphics & Applications, May 1986. pp. 25-34.

\* cited by examiner

ESTIMATING THINK TIMES USING A MEASURED RESPONSE TIME

BACKGROUND

This document relates to techniques for estimating think times during testing of computer resources.

To test how computing resources will perform in a production environment, conventional testing systems can submit requests from simulated users for processing by the computing resources that are being tested and measure the response time of the computing resources to the requests. Because each simulated user will generally submit multiple requests during testing, these conventional testing systems also generally employ a think time between each request submitted by a user. The think time is the amount of time between the time that a simulated user receives a response to a request and the time that the simulated user submits another request. Generally, the think time is an estimate of the time that a real user would delay between receiving a response to one request and submitting another request. Some conventional testing systems treat response time and think time as being independent. However, studies have shown that, for some real users, a longer response time to their provided request may result in a longer delay between receiving the response to the request and submitting a subsequent request.

SUMMARY

In general, one innovative aspect of the subject matter described in this specification can be embodied in methods that include the actions of: receiving a request to perform a test of one or more computing resources; and performing the test of the one or more computing resources by simulating an interaction of one or more simulated users with the one or more computing resources, wherein simulating the interaction of each of the users comprises: submitting a plurality of requests from the simulated user for execution by the one or more computing resources, measuring a respective response time of the one or more computing resources to each of the requests, and computing an estimated think time of the simulated user, wherein the estimated think time is computed based on at least one preceding response time. Other embodiments of this aspect include corresponding systems, apparatus, and computer programs, configured to perform the actions of the methods, encoded on computer storage devices.

These and other embodiments can each optionally include one or more of the following features. Submitting a plurality of requests comprises: submitting a first request from the simulated user for execution to the one or more computing resources; receiving a response to the first request submitted by the simulated user; waiting for a period of time defined by a current estimated think time; and submitting a second request from the simulated user for execution to the one or more computing resources. The actions include for each simulated user, launching a respective virtual machine, wherein the virtual machine executes a virtual desktop that includes one or more applications. The actions include receiving, at each virtual machine, display data from an application executing on the computing resources; and for each simulated user, submitting one or more requests for the application to perform one or more operations. The actions include receiving, for each simulated user, display data from an application executing on the computing resources; and for each simulated user, submitting one or more requests for the application to perform one or more operations. Computing an estimated think time comprises: identifying a plurality of ranges of response times that map to a plurality of ranges of estimated think times; determining that a preceding response time value is in a first range of the plurality of ranges of response times; and selecting an estimated think time from a first range of estimated think times that maps to the first range of response times. Computing an estimated think time comprises: identifying a plurality of ranges of response times that map to a plurality of ranges of estimated think times; determining that a preceding response time value is in a first range of the plurality of ranges of response times; obtaining a current response time, wherein the current response time is chronologically after the preceding response time; determining that the current response time value is in the first range of the plurality of ranges of response times; determining whether the current response time is greater than the preceding response time or less than the preceding response time; in response to determining whether the current response time is greater than the preceding response time or less than the preceding response time, modifying a range of estimated think times that maps to the first range of response times using a modification constant; and selecting an estimated think time from the modified range of estimated think times that maps to the first range of response times. Computing an estimated think time comprises: obtaining a current estimated think time; obtaining a current response time, wherein the current response time is chronologically after a preceding response time; determining whether the current response time is greater than the preceding response time or less than the preceding response time; and in response to the determination, modifying the current estimated think time with a modification constant. Determining whether the current response time is greater than the preceding response time or less than the preceding response time comprises: computing an addition of the preceding response time with a buffer value; computing a subtraction of the preceding response time with the buffer value; and determining whether the current response time is greater than the computed addition or less than the computed subtraction.

The subject matter described in this specification can be implemented in particular embodiments so as to realize one or more of the following advantages. In testing computing resources, simulated users can behave more like real users by incorporating correlations between response times and estimated think times of users. By more effectively estimating think times, test results will more accurately mirror what would occur in a production environment and tests that simulate user interaction with computing resources will produce more accurate results.

The details of one or more embodiments of the subject matter described in this document are set forth in the accompanying drawings and the description below. Other features, aspects, and advantages of the subject matter will become apparent from the description, the drawings, and the claims.

DETAILED DESCRIPTION

Figure 1:
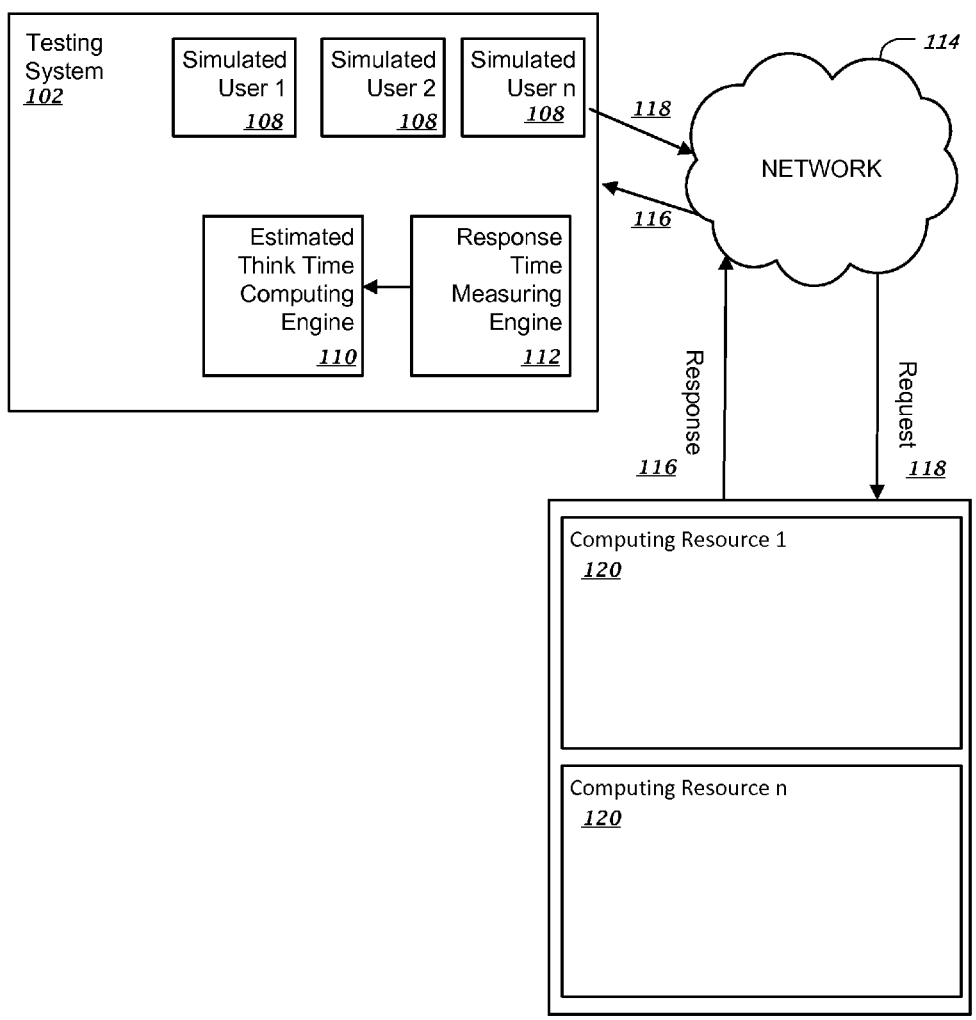
FIG. 1 shows an example testing system.

FIG. 1 shows an example testing system 102. The testing system 102 is an example of a system implemented as computer programs on one or more computers in one or more locations, in which the systems, components, and techniques described below can be implemented.

The testing system 102 is configured to create one or more simulated users 108 that provide requests to computing resources 120 over a network 114, i.e., the Internet, a LAN, a WAN, a virtual network, as part of performing a test of the computing resources 120. The computing resources 120 are software, hardware, or both that the testing system 102 has been configured to test. For example, the computing resources 120 can be clusters of virtual machines, and the testing system 102 may be configured to test the capacity of each of the clusters, e.g., to determine how many users each cluster can support without exceeding a threshold latency. As another example, each of the computing resources 120 can include the same software package executing on a different hardware configuration and the testing system 102 may be configured to benchmark the performance of the hardware configurations under various loads. Each simulated user 108 is implemented as one or more computer programs that simulate the interaction of a user with the computing resources 120 during the test.

During the test, the simulated users 108 submit requests 118 to the computing resources 120 for processing and receive responses 116. For example, in some cases, the computing resources 120 can execute and provide a desktop environment to each of the simulated users 108 using a remote display protocol, e.g., Remote Display Protocol or PC-over-IP (PCoIP), and receive requests from the simulated users 108 to perform operations in the remote desktop environment. As another example, in some other cases, the computing resources 120 may be a video game or one or more servers executing a video game. In these cases, as part of the test, a simulated user 108 can provide requests that simulate game play of the video game by an actual user.

The testing system 102 is configured to provide one or more different types of requests to the computing resources. Each simulated user 108 can select from the one or more types of requests by, e.g., selecting at random or following a pre-defined pattern inputted into the testing system. In some implementations, a pre-defined testing pattern can be inputted into the testing system 102 by a user or received from another system.

The testing system 102 includes a response time measuring engine 112 and an estimated think time computing engine 110. The response time measuring engine 112 calculates the time between a request 118 being provided to the computing resources 120 by a simulated user 108 and the time a response 116 to the request is received by the simulated user 108.

Think time defines the amount of time between a simulated user 108 receiving a response to a request and providing a subsequent request to the computing resources 120. The estimated think time computing engine 110 receives response times from the response time measuring engine 112 and computes updated think times based on one or more previously received response times. The estimated think time computing engine 110 can then provide updated think times to the testing system 102 to alter the behavior of the simulated users 108. That is, the testing system 102 can use the think time to determine how long to delay before a next request should be submitted by one of the simulated users 108. In particular, to accurately simulate the behavior of an actual user, each of the simulated users 108 is configured to delay a specified period of time between receiving a response to a request and submitting a next request. That delay is determined according to the current value of the think time computed by the estimated think time computing engine 110.

Figure 2:
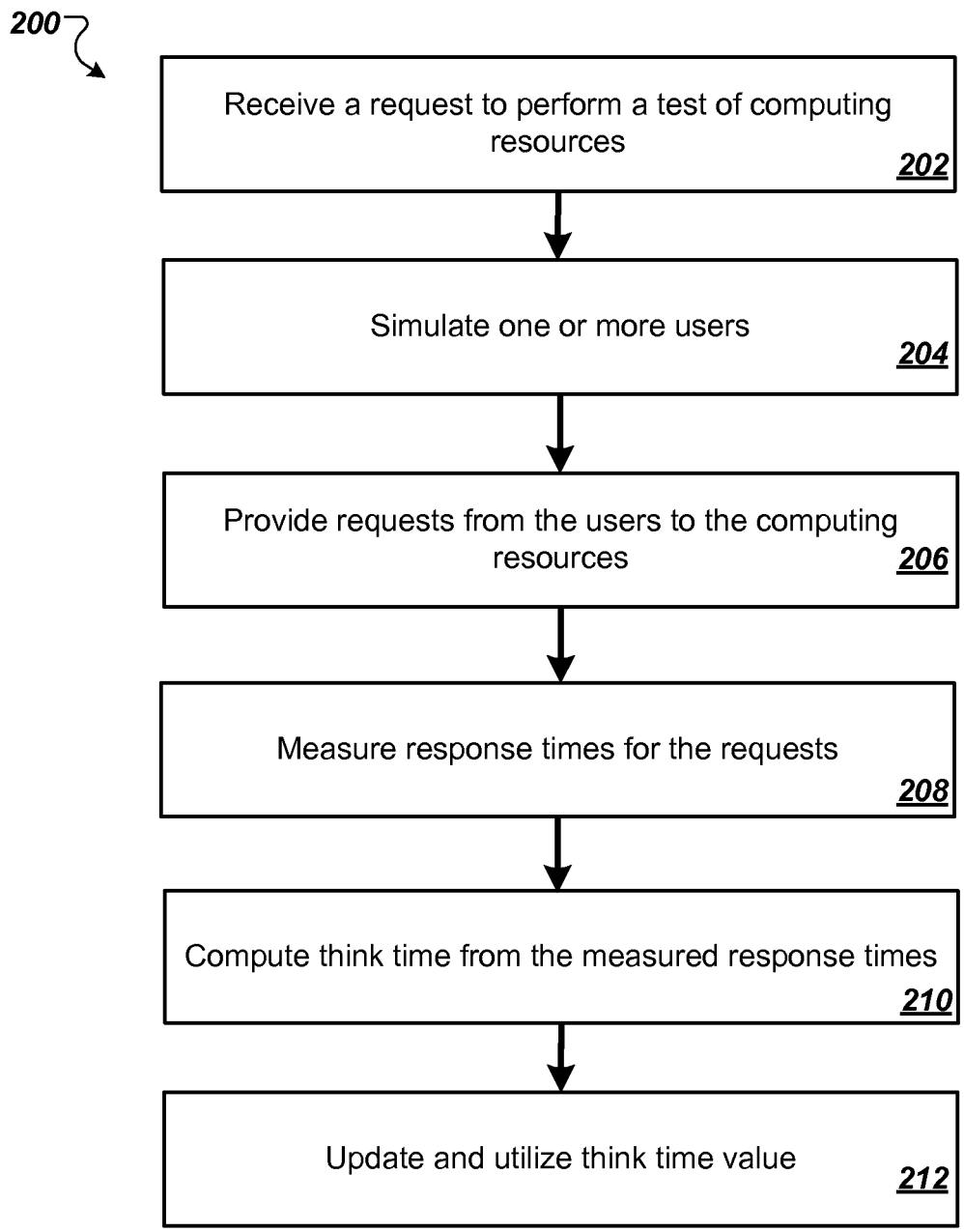
FIG. 2 illustrates an example process of determining an estimated think time for use in testing computing resources.

FIG. 2 illustrates an example process 200 of determining an estimated think time for use in testing computing resources. The process 200 will be described as being performed by a system of one or more appropriately programmed computers, e.g., the testing system 102 of FIG. 1.

The system receives a request to perform a test of one or more computing resources (step 202). The request can be submitted by a user, provided by another computer to the system, or the system can read one or more files stored on the system identifying a request. The request can define the type of test to perform on the computing resources, e.g., a capacity test to identify a maximum number of users the computing resources can service, a response time test to identify an acceptable level of latency for a specific number of users, and so on.

The system simulates one or more users (step 204). The number of simulated users can be specified in the test request received by the system. In some implementations, the system can launch a respective virtual machine for each user, and provide requests to the computing resources from each virtual machine that serve as the requests from that simulated user. In other implementations, the system can dedicate hardware resources to each simulated user, e.g., by assigning a respective physical machine to execute a process representing each user. In yet other implementations, the system can simulate each user without assigning a respective virtual machine to each user or dedicating hardware resources to each user. In these implementations, the system can provide requests from each user to the computing resources, and associate responses to respective users, by keeping track of an identifier for each user. The identifier can be associated with each request, and each respective response, allowing the system to determine response times for each user's provided requests, discussed below with reference to step 208.

The system provides requests from each of the simulated users to the computing resources (step 206). Each request is a request for the computing resources to perform an operation. The requested operations can relate to different test scenarios that the system has been configured to perform and can be specific to the type of computing resources the system is currently testing. For instance, a test scenario can include the simulated users being thin clients configured to receive a desktop environment from the computing resources with a remote display protocol. In that instance, a request can include requests to execute and provide applications, or requests to modify the desktop environment. Test scenarios can further include requests to the computing resources to provide remote applications to the simulated users, e.g., providing a word processor, a spreadsheet, design tools, a video game, and so on. In implementations where the simulated users are thin clients, an operation can include executing a particular application on the computing resources and providing display data from the application to the user, or any other operation that can be performed on a remote desktop environment.

The system measures a response time to each provided request (step 208). Response time is measured as the time between a simulated user providing a request and receiving a response to that request from the computing resources being tested. In some implementations where the system launches a virtual machine for each simulated user, the response time is measured by each virtual machine. In other implementations, the system can identify each request being provided as originating from a particular simulated user. Upon receiving a response to the request, the system can identify the simulated user that requested the response and measure the response time.

The system computes an estimated think time from at least one previous response time (step 210). The think time is used by the system to determine the time between a simulated user receiving a response to a request, and providing a subsequent request. In some implementations, the system can use different think times for one or more users, or different think times based on the type of request the simulated user is providing, e.g., a request related to a word processor, or a request related to a video game. Computing an estimated think time is described below with reference to FIGS. 3 and 4.

The system uses the computed think time value to determine the delay between the time that a simulated user receives a response to a request and submits another request (step 212). As noted above, the computed think time can be specific for each user, can be a global variable for all users, or can be specific to a type of request being provided to the computing resources. That is, the system may compute separate think times for each simulated user, a single think time that is used by each simulated user, or a separate think time for each type of request.

Figure 3:
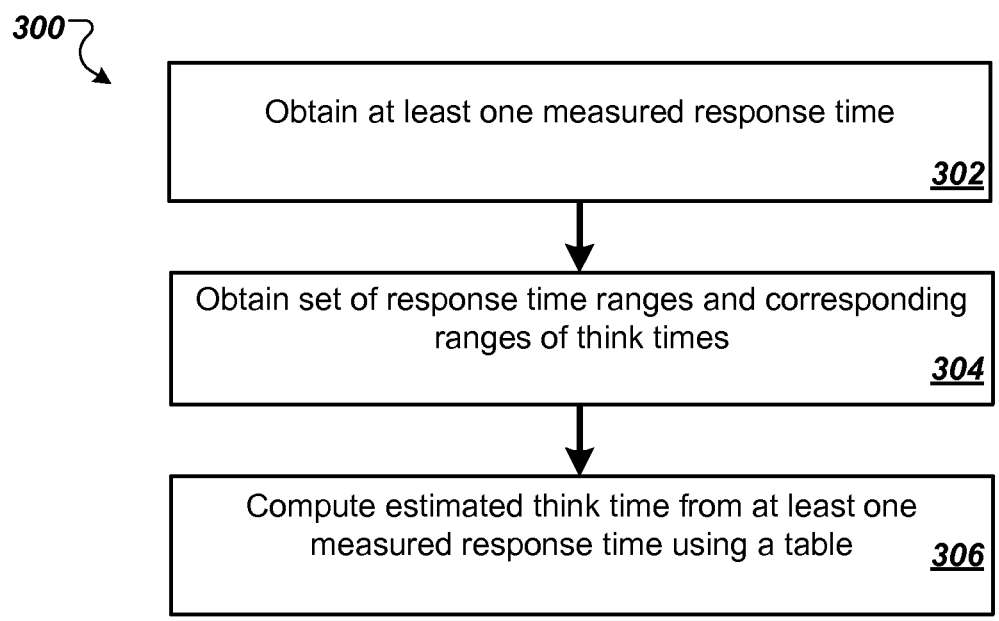
FIG. 3 illustrates an example process for computing estimated think times.

FIG. 3 illustrates an example process 300 for computing estimated think times. The process 300 will be described as being performed by a system of one or more appropriately programmed computers, e.g., the testing system 102 of FIG. 1.

The system obtains at least one measured response time (step 302). Each response time is a measurement of the amount of time between the time that a simulated user provided a request to computing resources during a test and the time that the simulated user received a response to that request. The system can compute an estimated think time using the most recently measured response time from the simulated user, or, if multiple response times are obtained, by averaging or otherwise combining the previous response times together.

The system obtains data identifying a set of multiple response time ranges and, for each range, a corresponding range of possible think times (step 304).

The system computes an estimated think time using the at least one measured response time and the data identifying the think time ranges (step 306). Each response time range maps a range of response time values to a range of think time values. The system can determine each think time value as a random value in a mapped think time range, or as the mid-point of the range. In some implementations, the ranges can be defined by a user and inputted into the system while in some other implementations the system can receive the ranges automatically from another computer. In some implementations, the ranges can be modified as response times are measured. For example, if the measured response times are generally in one range, and therefore generally map to one range of think times, the system can partition the range into multiple response time and respective think time ranges.

Table 1 illustrates example ranges used in computing estimated think times.

TABLE 1

| Measured Response Time (seconds) | Computed Estimated Think Time (seconds) |
|---|---|
| Low range: 0 to 0.5 | Random number from 0 to 5 |
| Medium range: 0.5 to 1.0 | Random number from 5 to 10 |
| High Range: greater than 1.0 | Random number from 10 to 15 |

For example, the system can obtain a measured response time of 0.6 seconds. The system then would identify a range of response times that includes the value 0.6, e.g., the medium range of Table 1. The system then accesses the mapped estimated think time range for a response time of 0.6 seconds, e.g., 5 to 10 seconds, and selects a value from the range. The estimated think time value could be selected randomly from the range, or selected as the mid-point of the range.

Figure 4:
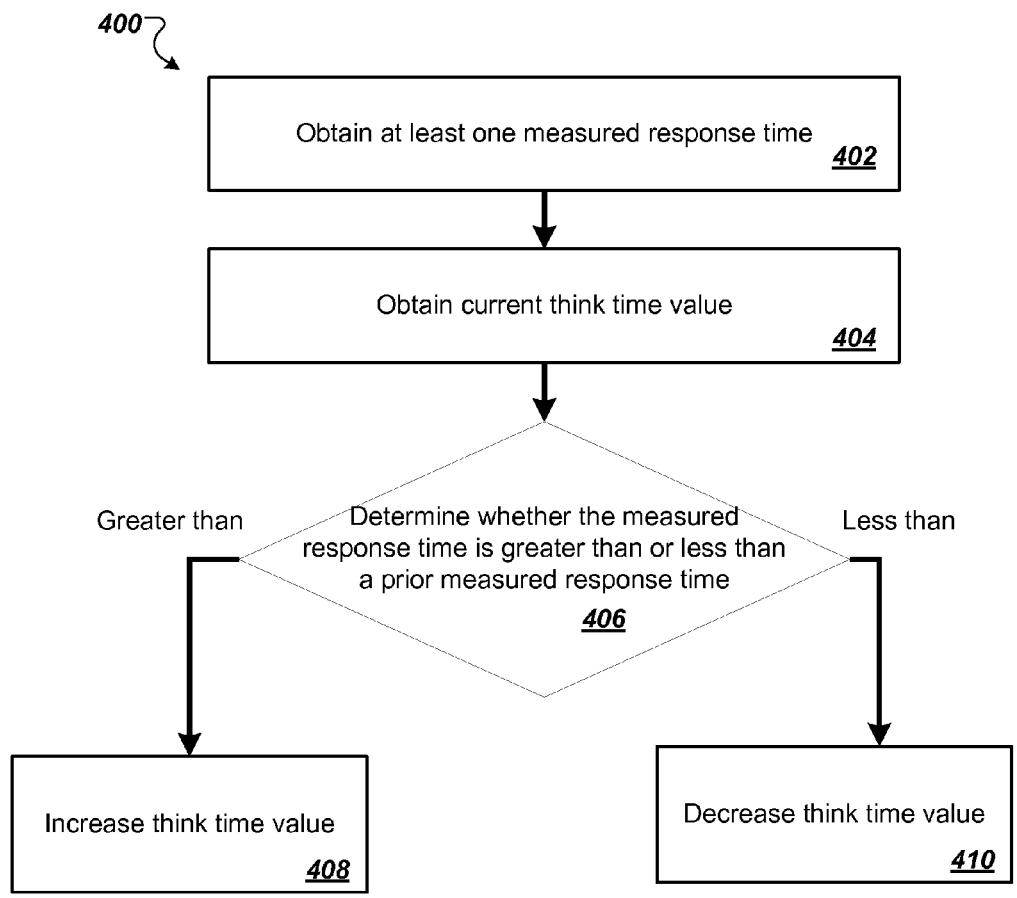
FIG. 4 illustrates another example process for computing estimated think times.

FIG. 4 illustrates another example process 400 for computing estimated think times. The process 400 will be described as being performed by a system of one or more appropriately programmed computers, e.g., the testing system 102 of FIG. 1.

The system obtains at least one measured response time (step 402), e.g., as described above in step 302.

The system determines the current think time value (step 404). In a first run of the system, the current think time value is an initial think time value. To obtain the initial think time value the system obtains a minimum and maximum think time value, and computes an initial think time between the two values. For example, the initial think time may be the mid-point between the values. In some implementations, the minimum and maximum think time values can be inputted by a user. In other implementations, they can be determined by the system empirically. Similarly, the system obtains a constant think time modification value that defines the degree to which a previously computed think time is modified based on a previously measured response time. In some implementations, the constant think time modification value can be defined by a user and inputted into the system, in other implementations the system can receive the value automatically from another computer.

The system determines whether the measured response time is greater than, or less than, a prior measured response time (step 406). In some implementations, the prior measured response time is the response time measured directly before the instant measured response time. In some implementations, the system can add a buffer to the determining step, e.g., determining whether the measured response time is greater than an upper bound value, i.e., a value created by adding the prior measured response time to a specified threshold value, or is less than a lower bound value, i.e., a value created by subtracting the specified threshold value from the prior measured response time. The specified threshold value can be inputted into the system by the user, and can be for example, 0.1, 0.15, or 0.2.

Upon a determination that the measured response time is greater than the prior measured response time, the system increases the think time value by computing a function of the think time value with the think time modification value (step 408). In some implementations, the function can be an addition of the think time modification value and the think time value. In other implementations, the function can be a multiplication of the think time modification value and the think time value. In some implementations, if the updated think time exceeds the maximum think time value, the system sets the updated think time value equal to the maximum value.

Upon a determination that the measured response time is less than the prior measured response time, the system decreases the think time value by computing a function of the think time value with the think time modification value (step 410). In some implementations, the function can be a subtraction of the think time modification value and the think time value. In other implementations, the function can be a division of the think time value by the think time modification value. In some implementations, if the updated think time value is less than the minimum think time value, the system sets the updated think time value equal to the minimum think time value.

In some implementations, the system can modify ranges of think time values using a think time modification value. For example, the system can obtain a first measured response time and map the response time to a think time range. The system can then obtain a newer second measured response time, and map the second response time to a think time range. The system can determine whether the first and second response times were mapped to the same think time range, and if so the system can modify the think time range. The system determines whether the second response time is greater than the first response time or less than the first response time. Upon a determination that the second response time is greater, the system modifies the think time range by adding a think time modification value to the upper and lower bounds of the think time range. Similarly, upon a determination that the second response time is less, the system modifies the think time range by subtracting a think time modification value from the upper and lower bounds of the think time range.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A computer-implemented method comprising:
   receiving a request to perform a test of one or more computing resources;
   performing the test of the one or more computing resources by simulating an interaction of one or more simulated users with the one or more computing resources, wherein simulating the interaction of each of the simulated users comprises:
   submitting a plurality of requests from the simulated user for execution by the one or more computing resources,
   measuring a respective response time of the one or more computing resources to each of the requests, and
   computing an estimated think time of the simulated user, wherein the estimated think time is computed using at least one preceding response time and a mapping between a plurality of ranges of response time values and a plurality of ranges of estimated think time values; and
   using the computed think time to determine a delay between a time that a simulated user receives a response to a particular request and submits another request.

2. The method of claim 1, wherein submitting a plurality of requests comprises:
   submitting a first request from the simulated user for execution to the one or more computing resources;
   receiving a response to the first request submitted by the simulated user;
   waiting for a period of time defined by a current estimated think time; and
   submitting a second request from the simulated user for execution to the one or more computing resources.

3. The method of claim 1, further comprising:
   for each simulated user, launching a respective virtual machine, wherein the virtual machine executes a virtual desktop that includes one or more applications.

4. The method of claim 3, further comprising:
   receiving, at each virtual machine, display data from an application executing on the computing resources; and
   for each simulated user, submitting one or more requests for the application to perform one or more operations.

5. The method of claim 1, further comprising:
   receiving, for each simulated user, display data from an application executing on the computing resources; and
   for each simulated user, submitting one or more requests for the application to perform one or more operations.

6. The method of claim 1, wherein computing an estimated think time comprises:
   identifying a plurality of ranges of response time values that map to a plurality of ranges of estimated think time values;
   determining that a particular preceding response time value is in a first range of the plurality of ranges of response time values; and
   selecting an estimated think time from a first range of estimated think times that maps to the first range of response times.

7. The method of claim 1, wherein computing an estimated think time comprises:
   identifying a plurality of ranges of response times that map to a plurality of ranges of estimated think times;
   determining that a particular preceding response time value is in a first range of the plurality of ranges of response times;
   obtaining a current response time, wherein the current response time is chronologically after the preceding response time;

determining that the current response time value is in the first range of the plurality of ranges of response times;
determining whether the current response time is greater than the preceding response time or less than the preceding response time;
in response to determining whether the current response time is greater than the preceding response time or less than the preceding response time, modifying a range of estimated think times that maps to the first range of response times using a modification constant; and
selecting an estimated think time from the modified range of estimated think times that maps to the first range of response times.

8. The method of claim 1, wherein computing an estimated think time further comprises:
obtaining a current estimated think time;
obtaining a current response time, wherein the current response time is chronologically after a preceding response time;
determining whether the current response time is greater than the preceding response time or less than the preceding response time; and
in response to the determination, modifying the current estimated think time with a modification constant.

9. The method of claim 8, wherein determining whether the current response time is greater than the preceding response time or less than the preceding response time comprises:
computing an addition of the preceding response time with a buffer value;
computing a subtraction of the preceding response time with the buffer value; and
determining whether the current response time is greater than the computed addition or less than the computed subtraction.

10. A system comprising:
one or more computers and one or more storage devices storing instructions that, when executed by the one or more computers, cause the one or more computers to perform operations comprising:
receiving a request to perform a test of one or more computing resources;
performing the test of the one or more computing resources by simulating an interaction of one or more simulated users with the one or more computing resources, wherein simulating the interaction of each of the users comprises:
submitting a plurality of requests from the simulated user for execution by the one or more computing resources,
measuring a respective response time of the one or more computing resources to each of the requests, and
computing an estimated think time of the simulated user, wherein the estimated think time is computed using at least one preceding response time and a mapping between a plurality of ranges of response time values and a plurality of ranges of estimated think time values; and
using the computed think time to determine a delay between a time that a simulated user receives a response to a particular request and submits another request.

11. The system of claim 10, wherein submitting a plurality of requests comprises:
submitting a first request from the simulated user for execution to the one or more computing resources;
receiving a response to the first request submitted by the simulated user;
waiting for a period of time defined by a current estimated think time; and
submitting a second request from the simulated user for execution to the one or more computing resources.

12. The system of claim 10, wherein the operations further comprise:
for each simulated user, launching a respective virtual machine, wherein the virtual machine executes a virtual desktop that includes one or more applications.

13. The system of claim 12, wherein the operations further comprise:
receiving, at each virtual machine, display data from an application executing on the computing resources; and
for each simulated user, submitting one or more requests for the application to perform one or more operations.

14. The system of claim 10, wherein the operations further comprise:
receiving, for each simulated user, display data from an application executing on the computing resources; and
for each simulated user, submitting one or more requests for the application to perform one or more operations.

15. The system of claim 10, wherein computing an estimated think time comprises:
identifying a plurality of ranges of response time values that map to a plurality of ranges of estimated think time values;
determining that a particular preceding response time value is in a first range of the plurality of ranges of response time values; and
selecting an estimated think time from a first range of estimated think times that maps to the first range of response times.

16. The system of claim 10, wherein computing an estimated think time comprises:
identifying a plurality of ranges of response times that map to a plurality of ranges of estimated think times;
determining that a particular preceding response time value is in a first range of the plurality of ranges of response times;
obtaining a current response time, wherein the current response time is chronologically after the preceding response time;
determining that the current response time value is in the first range of the plurality of ranges of response times;
determining whether the current response time is greater than the preceding response time or less than the preceding response time;
in response to determining whether the current response time is greater than the preceding response time or less than the preceding response time, modifying a range of estimated think times that maps to the first range of response times using a modification constant; and
selecting an estimated think time from the modified range of estimated think times that maps to the first range of response times.

17. The system of claim 10, wherein computing an estimated think time comprises:
obtaining a current estimated think time;
obtaining a current response time, wherein the current response time is chronologically after a preceding response time;
determining whether the current response time is greater than the preceding response time or less than the preceding response time; and in response to the determination, modifying the current estimated think time with a modification constant.

18. The system of claim 17, wherein determining whether the current response time is greater than the preceding response time or less than the preceding response time comprises:
- computing an addition of the preceding response time with a buffer value;
- computing a subtraction of the preceding response time with the buffer value; and
- determining whether the current response time is greater than the computed addition or less than the computed subtraction.

19. A non-transitory computer-readable storage medium encoding instructions that when executed by one or more computers cause the one or more computers to perform operations comprising:
- receiving a request to perform a test of one or more computing resources;
- performing the test of the one or more computing resources by simulating an interaction of one or more simulated users with the one or more computing resources, wherein simulating the interaction of each of the users comprises:
  - submitting a plurality of requests from the simulated user for execution by the one or more computing resources,
  - measuring a respective response time of the one or more computing resources to each of the requests, and
  - computing an estimated think time of the simulated user, wherein the estimated think time is computed using at least one preceding response time and a mapping between a plurality of ranges of response time values and a plurality of ranges of estimated think time values; and
- using the computed think time to determine a delay between a time that a simulated user receives a response to a particular request and submits another request.

20. The non-transitory computer-readable storage medium of claim 19, wherein submitting a plurality of requests comprises:
- submitting a first request from the simulated user for execution to the one or more computing resources;
- receiving a response to the first request submitted by the simulated user;
- waiting for a period of time defined by a current estimated think time; and
- submitting a second request from the simulated user for execution to the one or more computing resources.

* * * * *